July 30, 1968 R. W. KETCHLEDGE 3,395,357

AUTOMATIC GAIN CONTROL SYSTEM

Filed Sept. 22, 1966

INVENTOR
R. W. KETCHLEDGE
BY John K. Mullarney
ATTORNEY

United States Patent Office 3,395,357
Patented July 30, 1968

3,395,357
AUTOMATIC GAIN CONTROL SYSTEM
Raymond W. Ketchledge, Wheaton, Ill., assignor to Bell Telephone Laboratories, Incorporated, Berkeley Heights, N.J., a corporation of New York
Filed Sept. 22, 1966, Ser. No. 581,311
6 Claims. (Cl. 330—29)

Figure 1:
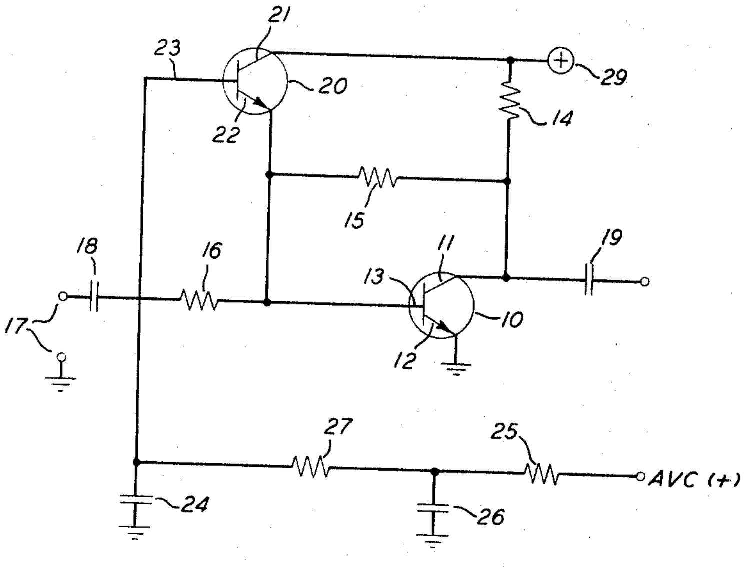

This invention relates to automatic gain control systems for signal translating apparatus and, more particularly, to an automatic gain control system for use in transistorized signal receivers.

Signal receivers are generally provided with an automatic gain control (AGC) system for maintaining the amplitude of the signal applied to the second detector substantially constant. By providing an automatic gain control system, the amplifier gain of the receiver is constantly automatically adjusted to compensate for a relatively wide range of variations in the amplitude of the received signal. For example, for a strong signal the amplifier is automatically adjusted to a low gain, and conversely for a weak signal the amplifier is automatically adjusted to a high gain. The gain of the amplifier is adjusted in response to an automatic gain control voltage derived from the second detector of the signal receiver. This automatic gain control voltage is applied to the amplifier, via a low-pass filter, so that only the direct current component of the voltage is used for control purposes.

Generally, transistorized signal receivers utilize one of two methods of automatic gain control. One method varies the emitter current gain of the transistor amplifier inversely with the strength of the received signal. The other method varies the collector voltage gain of the transistor amplifier inversely with the strength of the received signal. The gain in each method, in the case of common emitter connected amplifiers, is controlled by applying the automatic gain control voltage to the base of the transistor amplifier to vary the biasing thereof, and thereby shift its operating point to effect the desired reduction in gain.

The automatic gain control systems, as discussed above, however, are limited in the range of signals for which the gain can be controlled without signal distortion. This range is approximately 20 db. Received signals, however, often vary in amplitude over a range which exceeds 20 db, thus, making it necessary in automatic gain control systems to control the gains through a plurality of cascaded amplifiers.

An improved automatic gain control system disclosed in my Patent 3,027,518, issued May 27, 1962, achieves a wider range of automatic gain control than heretofore realized. In this system a diode is connected between the source of automatic gain control voltage and the base of a common emitter connected transistor amplifier. The diode is normally back-biased thereby prohibiting the application of the automatic gain control voltage to the transistor base. As the automatic gain control voltage increases in magnitude, the diode is forward biased and the automatic gain control voltage applied to the base of the transistor drives it into the saturation region thereby significantly reducing its amplification gain. The diode, when forward biased, additionally provides a shunt path to ground for large transients of the incoming signal. The necessary signal power for gain control, however, is not always available from the sources of the automatic gain control voltage over the wide range of control desired. In addition, the low impedance of the transistor in saturation limits the permissible impedance of the low-pass filter through which the automatic gain control voltage is transmitted.

It is therefore an object of the present invention to economically achieve automatic gain control with a minimum expenditure of power of the automatic gain control voltage source.

It is another object of the invention to increase the amplitude range over which the gain of a single transistor amplifier can regulate.

It is still another object of the invention to permit the use of a higher impedance filter in the path of the automatic gain control voltage than has heretofore been used.

It is yet another object of this invention to achieve automatic gain control over a wide range with minimum distortion of large signals.

These and other objects are obtained in accordance with the present invention by applying the automatic gain control voltage to the base electrode of a normally nonconducting gain control injection transistor, whose collector emitter path interconnects a direct current energizing potential to the base electrode of a common emitter connected transistor amplifier. The collector emitter path is biased into conduction in response to a preselected level of the automatic gain control voltage, thereby, permitting application of the direct current energizing potential to the base electrode of the transistor amplifier. The direct current energizing potential increases the forward bias of the transistor amplifier and shifts its operating point into the saturation region. By operating in the saturation region the gain of the transistor amplifier is significantly reduced.

A feature of the present invention is the utilization of the base emitter paths of both the gain control injection transistor and the transistor amplifier as low impedance signal paths to ground for opposite polarity transients of the incoming signal. These low impedance signal paths advantageously further reduce the magnitude of the incoming signal without causing signal distortions and hence additionally increase the range of gain control.

Figure 2:
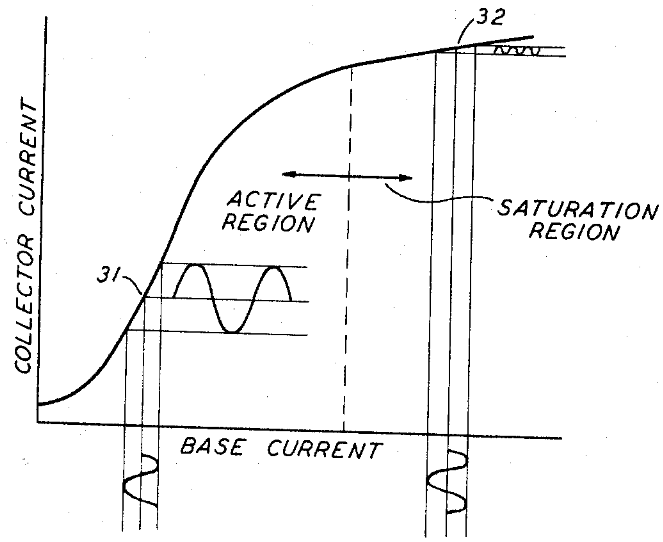

Other objects and features of the invention will be more readily understood from the following detailed description taken in conjunction with the accompanying drawings wherein:

FIG. 1 is a schematic circuit diagram of a transistorized amplification stage and the automatic gain control system therefor in accordance with the present invention; and FIG. 2 is a dynamic transfer characteristic curve useful in explaining the operation of the present invention.

FIG. 1 of the drawings shows an amplifier comprising a transistor 10 connected for signal amplification operation in a common emitter configuration. The amplifier constitutes a single amplification stage of a signal translating apparatus such as a radio receiver. The amplifier precedes the second detector from which the automatic gain control voltage is derived.

The transistor 10, for illustrative purposes is of the NPN type and includes a collector electrode 11, an emitter electrode 12, and a base electrode 13. The collector electrode 11 is connected, via a collector load resistor 14, to a positive direct current (DC) potential source 29; the emitter electrode 12 is connected directly to ground; and the base electrode 13 is connected, via the resistors 15 and 14, to the DC potential source 29 for the purpose of forward biasing the base emitter junction of the transistor 10.

The incoming signals are applied to the amplifier circuit through a pair of terminals 17, one of which is grounded and the other of which is connected through a coupling capacitor 18 and a resistor 16 to the base electrode 13. The impedance value of resistor 16 is equal to or larger than the forward biased base emitter impedance of the transistor 10. The resistor 16 increases the gain control regulation range of the amplifier circuit, as described hereinbelow. The output signal appearing at the collector electrode 11 is coupled, via the capacitor 19, to the next succeeding stage (not shown) of the signal translating apparatus.

A gain control injection transistor 20 has its collector electrode 21 connected to the DC potential source 29. Its emitter electrode 22 is connected to a common junction of the resistor 15 and the base electrode 13 of the transistor 10. A positive, automatic gain control (AGC) voltage, derived from the subsequent second detector stage of the receiver, is filtered by a low-pass resistance capacitance filter network, comprising resistors 25 and 27 and capacitor 26, and is applied to the base electrode 23 of the injection transistor 20.

The base emitter junction of the gain control injection transistor 20 is normally slightly reverse biased by the small positive potential appearing, via resistor 15, at its emitter electrode 22. In this state the injection transistor 20 does not transmit any direct current potential of the DC potential source 29 to the base electrode 13. However, as the carrier level of the incoming signal increases, the automatic gain control voltage level is increased to a point at which the slight reverse bias of the base emitter junction of the injection transistor 20 is overcome, thereby, biasing its collector emitter path into a state of conduction. With the collector emitter path of the injection transistor 20 in a conducting state, the positive potenial of the DC potential source 29 is applied to the base electrode 13 of the transistor 10 where it increases its forward bias and shifts the operating point of the transistor 10 into the saturation region.

It will be apparent to those skilled in the art that the gain control injection transistor 20 is connected in an emitter follower configuration. The emitter follower configuration presents a high input impedance to the output of the low-pass filter, comprising resistors 25 and 27 and capacitor 26, irrespective of changes in the impedance of the transistor 10. Hence changes in the impedance of the transistor 10, even the low saturation impedance, will not excessively load down the low-pass filter and, therefore, a higher impedance low-pass filter may be used.

FIG. 2 is a dynamic transfer characteristic curve of a common emitter connected transistor amplifier and diagrammatically shows the behavior of signals at the collector electrode 11 in response to signals applied to the base electrode 13. For example, the operating point 31 lies in the normal active region of the transistor. It is readily apparent that when the transistor 10 is normally forward biased in the active region, so that its operating point coincides with the illustrated operating point 31, the input signal to the base electrode 13 is amplified into a larger collector signal. However, should the operating point be shifted to the illustrated operating point 32, which lies in the saturation region, the resultant collector signal has little or no amplification with respect to the input signal to base electrode 13. Hence, it is readily apparent that, by shifting the operating point of transistor 10 into the saturation region, its gain is significantly reduced.

In addition to reducing gain by operating the transistor 10 in the saturation region, the base emitter paths of the two transistors 10 and 20 additionally serve as low impedance signal paths to ground for the incoming signal; thus significantly reducing its level and hence the ultimate output signal level at the collector electrode 11. Large positive transients in the incoming signal are shorted to ground by the base emitter path of transistor 10, and large negative transients in the incoming signal are shorted to ground by the base emitter path of the gain control injection transistor 20 and the capacitor 24.

To additionally assist in reducing the ultimate gain, a large impedance 16, as described hereinabove, is inserted in the path of the incoming signal to reduce the applied voltage across the base emitter paths of transistors 10 and 20 through voltage divider action. This considerably reduces the signal magnitude that the short circuit paths of the transistors 10 and 20 must accommodate and hence increases the range over which the gain control of the amplifier can regulate.

While the invention has been described in terms of NPN type transistors, it is obvious that the principles of applicant's invention are equally applicable to PNP type transistors. It is to be further understood that, while only one amplifier stage is shown, the principles of the invention are equally applicable to cascaded stages of amplification. While only one embodiment of the invention has been shown, numerous modifications or alterations may be made thereto without departing from the spirt and scope of the invention.

What is claimed is:

1. An automatic gain control system comprising an amplifier including a first transistor connected in a common emitter configuration, a source of automatic gain control voltage, a source of direct current energizing potential, a second transistor, means to reverse bias said second transistor into a nonconducting state, said second transistor having collector and emitter electrodes respectively connected to said source of direct current energizing potential and the base electrode of said first transistor, means to overcome said reverse bias including means to apply said automatic gain control voltage to the base electrode of said second transistor, the operating point of said second transistor being shifted into an active conduction state in response to a preselected magnitude of said automatic gain control voltage, and the collector emitter path of said second transistor in said conduction state enabling the application of a sufficient magnitude of said direct current energizing potential to the base electrode of said first transistor to shift the operating point of said first transistor into the saturation region.

2. An automatic gain control system as defined in claim 1 wherein the base electrode of said second transistor is capacitively coupled to ground, the base emitter path of said second transistor thereby providing a low impedance path for large transient incoming signals to ground.

3. An automatic gain control system as defined in claim 2 wherein an impedance of a magnitude equal to or greater than the base emitter impedance of said first transistor is inserted in the path of the incoming signal and connected to the junction of the base electrode of said first transistor and the emitter electrode of said second transistor.

4. A signal amplifier comprising a first transistor having a base, an emitter and a collector operatively connected in a common emitter configuration, a second transistor of the same type as said first transistor and having a base, an emitter and a collector, a direct current source of selected energizing potential, a source of automatic gain control voltage, means connecting the base of said second transistor to said source of automatic gain control voltage, a first impedance means interconnecting said direct current source and the collector of said first transistor, the collector of said second transistor directly connected to said direct current source, the base of said first transistor and the emitter of said second transistor being connected to a common junction, and a second impedance means interconnecting the collector of said first transistor to said common junction so as to forward bias said first transistor into conduction and reverse bias said second transistor into nonconduction, said automatic gain control voltage overcoming said reverse bias at a predetermined level and forward bias said second transistor into conduction, and said first transistor in response to the energizing potential transmitted by the collector-emitter path of said second transistor serving to be driven into its saturation region.

5. A signal amplifier as defined in claim 4 wherein a third impedance having a magnitude equal to or larger than the forward biased base emitter impedance of said first transistor is inserted in the path of the incoming signal and connected to said common junction thereby limiting the voltage magnitude of said incoming signal as applied to said common junction.

6. A signal amplifier as defined in claim 5 wherein the base electrode of said second transistor is capacitively coupled to ground and the forward biased base emitter paths of said first and second transistors serve as ground return paths for large transients of said incoming signal.

References Cited

UNITED STATES PATENTS 3,360,735 12/1967 Fujimoto ---------- 330—29 X

ROY LAKE, *Primary Examiner.*

J. B. MULLINS, *Assistant Examiner.*